(12) United States Patent
Bucher (10) Patent No.: US 9,668,380 B2
(45) Date of Patent: May 30, 2017

(54) CONFORMABLE THERMAL BRIDGE

(71) Applicant: TYCO ELECTRONICS CORPORATION, Berwyn, PA (US)

(72) Inventor: Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 14/868,511

(22) Filed: Sep. 29, 2015

(65) Prior Publication Data
US 2017/0094830 A1    Mar. 30, 2017

(51) Int. Cl.
*H05K 7/20* (2006.01)
*H05K 1/02* (2006.01)

(52) U.S. Cl.
CPC .......... *H05K 7/205* (2013.01); *H05K 1/0203* (2013.01); *H05K 2201/066* (2013.01)

(58) Field of Classification Search
CPC ..... H01L 23/367; H01L 23/3735; G06F 1/20; G06F 1/203; H05K 1/0203; H05K 1/141; H05K 1/189; H05K 1/0204; H05K 3/284; H05K 3/325; H05K 7/20772; H05K 3/326; H05K 2201/0397; H05K 2201/0355; H05K 7/20436; H05K 7/2039; H05K 7/205; H05K 2201/066
USPC ........... 361/679.54, 707, 709, 712, 714–723
See application file for complete search history.

(56) References Cited

U.S. PATENT DOCUMENTS

| | | | | |
|---|---|---|---|---|
| 3,020,451 A | * | 2/1962 | McAdam | H01J 5/12 165/80.3 |
| 4,442,450 A | * | 4/1984 | Lipschutz | H01L 23/433 165/80.2 |
| 4,769,744 A | * | 9/1988 | Neugebauer | H01L 23/32 257/719 |
| 5,650,914 A | | 7/1997 | DiStefano et al. | |
| 6,026,895 A | * | 2/2000 | Moresco | F28F 3/02 165/185 |
| 6,411,513 B1 | * | 6/2002 | Bedard | H01L 23/3672 165/185 |
| 6,890,618 B2 | | 5/2005 | Hornung | |
| 7,616,444 B2 | * | 11/2009 | Munch | H01L 23/40 165/104.33 |

(Continued)

FOREIGN PATENT DOCUMENTS

JP    S57015449 A    1/1982

OTHER PUBLICATIONS

European Search Report, European Application No. 16191089.8, International Filing Date Jan. 20, 2017.

*Primary Examiner* — Adam B Dravininkas (57) ABSTRACT

A thermal bridge includes a frame and an array of multiple plates. The frame defines a bridge opening, and the array of plates is held in the bridge opening. The plates are stacked side-by-side along a stack axis. The array extends between a top end defined by top edges of the plates and a bottom end defined by bottom edges of the plates. Each plate is independently vertically compressible between the respective top and bottom edges of the plate relative to other plates in the array. The top end of the array is configured to engage and conform to a contour of a first external surface. The bottom end of the array is configured to engage and conform to a contour of a second external surface. The plates are thermally conductive to transfer heat between the first and second external surfaces.

20 Claims, 7 Drawing Sheets

(56) References Cited

U.S. PATENT DOCUMENTS

| | | | |
|---|---|---|---|
| 2004/0252462 A1* | 12/2004 | Cromwell | H01L 23/4093 361/719 |
| 2008/0144288 A1 | 6/2008 | Karidis et al. | |
| 2009/0229808 A1 | 9/2009 | Chu | |
| 2010/0122461 A1* | 5/2010 | Minas | H01M 8/04074 29/890.034 |
| 2011/0075377 A1 | 3/2011 | Paquette et al. | |
| 2011/0310566 A1* | 12/2011 | Holahan | H01L 23/433 361/718 |
| 2012/0147563 A1* | 6/2012 | Colbert | G06F 1/20 361/715 |
| 2012/0218715 A1* | 8/2012 | Hirose | H01L 21/4871 361/714 |
| 2013/0027889 A1* | 1/2013 | Macall | H01L 23/4006 361/720 |
| 2014/0177166 A1* | 6/2014 | Nardi | H01L 23/3672 361/679.54 |

* cited by examiner

CONFORMABLE THERMAL BRIDGE

BACKGROUND OF THE INVENTION

The subject matter herein relates generally to thermal bridges for providing thermally conductive paths between thermal elements or components.

Electrical components, such as resistors, capacitors, transistors, inductors, integrated circuits, light emitting diodes (LEDs), and the like, disposed on circuit boards or other substrates typically generate heat during use. The electrical components are often enclosed in a case or housing of a device in order to protect the electrical components from exterior contaminants such as moisture and debris. In an example, a circuit board having one or more electrical components may be secured within a connector housing of a plug or receptacle electrical connector. A build-up of heat in the enclosure may negatively affect the operations of the electrical components, so heat transfer devices may be installed to transfer heat from inside the enclosure to outside the enclosure. Thermal bridges are installed between the heat generating components (for example, the electrical components and/or the circuit board) and the heat receiving components (for example, the enclosure and/or a heat sink on the enclosure) to provide a thermally conductive path from the heat generating components to the heat receiving components to transfer heat away from the heat generating components.

Some known thermal bridges are solid thermally-conductive blocks that have a fixed height between the heat generating components and the heat receiving components. But, the distance (or height of the gap) between the heat generating components and the heat receiving components may vary along a length and/or width of the components. For example, some heat generating electrical components on a circuit board may be taller than other heat generating electrical components on the circuit board. Due to the fixed height of the known thermal bridges, the thermal bridges are not able to properly conductively couple to both the taller and the shorter electrical components on the circuit board. For example, the thermal bridge may engage a taller electrical component and may define a gap between the thermal bridge and a shorter electrical component. Due to the gap, the resistance of the thermal path from the shorter component to the thermal bridge is significantly increased. Due to variations in the heights or distances between the heat generating components and the heat receiving components, some thermal bridges include a thermal interface material at heat transfer interfaces of the thermal bridges. The thermal interface materials may include underfilms, encapsulants, putties, or the like. The thermal interface materials may be at least partially compliant to accommodate some variation in height, but the thermal interface materials may not be able to accommodate some height variations that are greater than a compliancy range of the thermal interface materials, and the thermal interface materials may not be able to conform properly to a high frequency of variations along a length and/or width of the heat generating and/or heat receiving components.

BRIEF DESCRIPTION OF THE INVENTION

In an embodiment, a thermal bridge is provided that includes a frame and an array of multiple plates. The frame defines a bridge opening that extends through the frame. The array of plates is held in the bridge opening of the frame. The plates are stacked side-by-side along a stack axis. The array extends between a top end defined by top edges of the plates and a bottom end defined by bottom edges of the plates. Each plate is independently vertically compressible between the respective top and bottom edges of the plate relative to other plates in the array. The top end of the array is configured to engage and conform to a contour of a first external surface. The bottom end of the array is configured to engage and conform to a contour of a second external surface. The plates are thermally conductive to transfer heat between the first and second external surfaces.

In another embodiment, a thermal bridge is provided that includes a frame and an array of multiple plates. The frame defines a bridge opening that extends through the frame. The array of plates is held in the bridge opening of the frame. The array extends vertically between a top end and a bottom end. The plates are stacked side-by-side along a stack axis. The plates have unitary, one-piece bodies that include a rigid segment and a deformable segment. The deformable segment of each plate is independently vertically compressible relative to other plates in the array. The array of plates includes upper plates and lower plates arranged in an alternating sequence. The upper plates have a same size and shape as the lower plates and are rotated 180° about the stack axis relative to the lower plates. The top end of the array is defined by the rigid segments of the upper plates and the deformable segments of the lower plates. The bottom end of the array is defined by the deformable segments of the upper plates and the rigid segments of the lower plates. The top end of the array is configured to engage and conform to a contour of a first external surface, and the bottom end of the array is configured to engage and conform to a contour of a second external surface. The plates are thermally conductive to transfer heat between the first and second external surfaces.

DETAILED DESCRIPTION OF THE INVENTION

Figure 1:
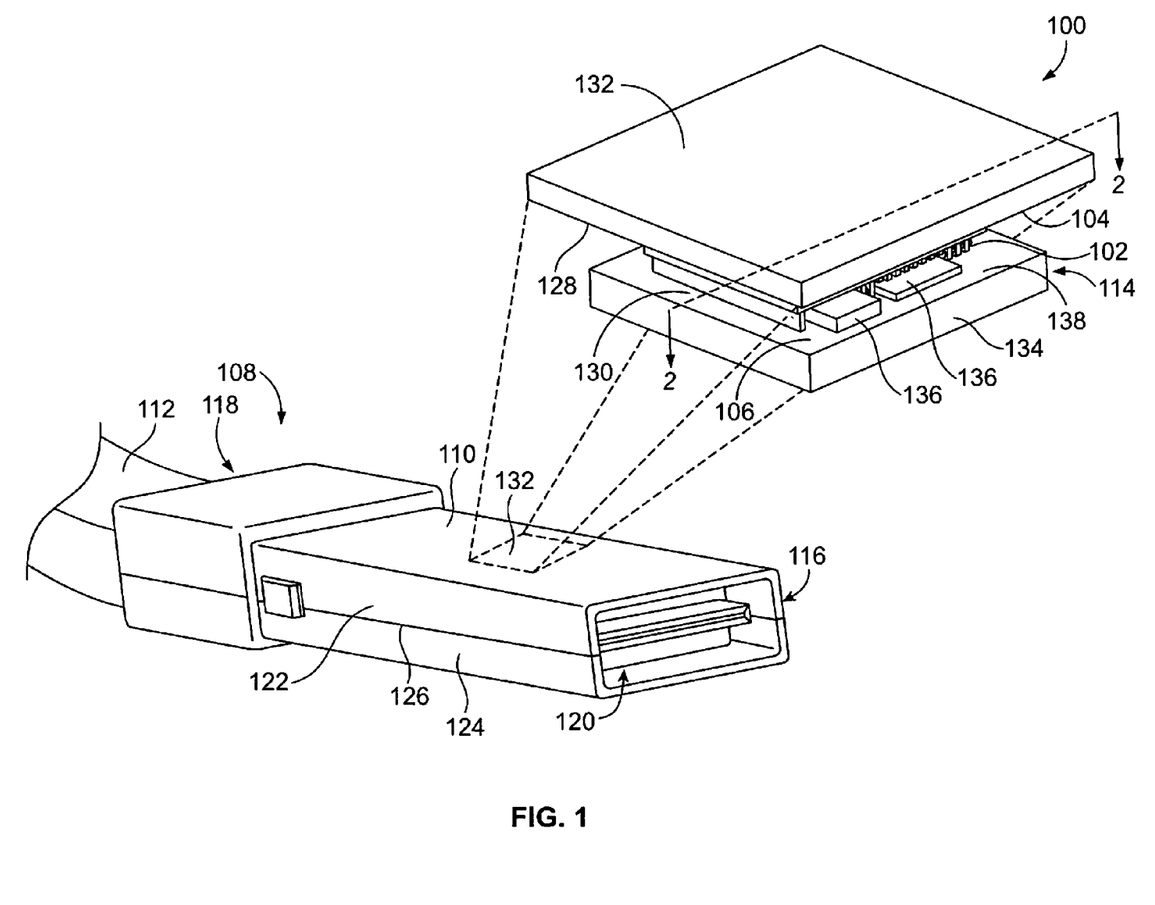
FIG. 1 is a top perspective view of a heat transfer system according to an embodiment.

FIG. 1 is a top perspective view of a heat transfer system 100 according to an embodiment. The heat transfer system 100 includes a thermal bridge 102, a first external surface 104, and a second external surface 106. The thermal bridge 102 is disposed between the first and second external surfaces 104, 106, which are spaced apart from one another.

The thermal bridge 102 is configured to engage both the first and second external surfaces 104, 106 to conductively transfer heat between the first and second external surfaces 104, 106 across the space therebetween.

The distance between the first and second external surfaces 104, 106 may vary along a plane. For example, the contour of the first external surface 104 and/or the contour of the second external surface 106 may include various steps, projections, depressions, or the like along the respective external surface 104, 106. Alternatively, or in addition, a plane of the first external surface 104 may not extend parallel to a plane of the second external surface 106 such that the distance between the first and second external surfaces 104, 106 varies. In the illustrated embodiment, the contour of the first external surface 104 is planar, and the first external surface extends parallel to a plane of the second external surface 106. The contour of the second external surface 106 includes multiple upward steps and downward steps such that the contour is not planar and the distance between the first and second external surfaces 104, 106 varies. In an exemplary embodiment, the thermal bridge 102 is configured to engage and conform to both the contour of the first external surface 104 and the contour of the second external surface 106. The thermal bridge 102 is thermally conductive such that the thermal bridge 102 conductively transfers heat between the first and second external surfaces 104, 106 along substantially an entirety of the respective external surfaces 104, 106. Thus, there may be only limited, narrow gaps along the contours of the first and second external surfaces 104, 106 that are not engaged by the thermal bridge 102 for heat transfer.

The thermal bridge 102 may be used in various electrical applications in order to transfer heat from a heat generating component to a heat receiving component. For example, the thermal bridge 102 may be installed within a case or housing that encloses an electronics package that generates heat. The electronics package may be a printed circuit board, a server, a router, a processor (for example, a microprocessor or a central processing unit or CPU), an electric-optic integrated circuit that converts electrical signals to optical signals and/or vice-versa, or the like. To prevent the build-up of heat within the respective case that encloses the electronics package, the thermal bridge 102 may be installed between the electronics package and a wall of the case in order to dissipate heat from the enclosed area through the wall of the case to ambient air outside of the case.

In the illustrated embodiment, the heat transfer system 100 is a portion of a pluggable, cable-mounted connector 108. The pluggable connector 108 may be an input/output (I/O) module or transceiver that is configured to be inserted into and removed from a mating connector (not shown). The pluggable connector 108 may be configured to transmit data signals in the form of electrical signals or optical signals. The pluggable connector 108 may be configured to convert data signals from optical signals to electrical signals or vice-versa. More specifically, the pluggable connector 108 may be a small form-factor pluggable (SFP) transceiver or quad small form-factor pluggable (QSFP) transceiver. The pluggable connector 108 may satisfy certain technical specifications for SFP or QSFP transceivers, such as Small-Form Factor (SFF)-8431. In some embodiments, the pluggable connector 108 is configured to transmit data signals up to 2.5 gigabits per second (Gbps), up to 5.0 Gbps, up to 10.0 Gbps, or more.

The pluggable connector 108 includes a shell 110, a cable 112, and at least one electronics package 114. The shell 110 includes a mating end 116 and a cable end 118. The cable 112 is coupled to the shell 110 at the cable end 118. The electronics package 114 is held within a cavity of the shell 110. The electronics package 114 is electrically and/or optically connected to the cable 112, which may include electrical wires and/or optical fibers. The shell 110 defines a socket opening 120 at the mating end 116. The socket opening 120 is configured to receive a portion of the mating connector therein to engage an exposed contact segment of the electronics package 114 (or to engage discrete contacts that are electrically and/or optically connected to the electronics package 114). The shell 110 is formed of a thermally conductive material. The shell 110 optionally may be formed of an electrically conductive material to provide shielding for the electronics package 114. The shell 110 optionally may be formed by coupling two shell members 122, 124 at an interface 126.

In the illustrated embodiment, the first external surface 104 is an interior surface 128 of the shell member 122. The second external surface 106 is an outer surface 130 of the electronics package 114 that faces the interior surface 128. The thermal bridge 102 is disposed between the interior surface 128 and the outer surface 130, and engages both surfaces, to transfer heat from the electronics package 114 to the shell member 122. The heat absorbed by the shell member 122 is dissipated outside of the shell 110 into ambient air. Although not shown, the shell member 122 may define fins along an exterior surface 132 thereof to increase a surface area of the shell member 122 in engagement with the ambient air. Alternatively, a separate active or passive heat sink may be mounted on the exterior surface 132 of the shell member 122 to increase heat dissipation, and therefore cooling.

As shown and described in more detail below, the electronics package 114 in an embodiment includes a printed circuit board 134 and at least one electrical component or device 136 mounted on an outer layer 138 of the printed circuit board 134. The printed circuit board 134 is oriented such that the outer layer 138 faces the interior surface 128 of the shell member 122. The contour of the outer surface 130 of the electronics package 114 is defined by the outer layer 138 of the printed circuit board 134 and the electrical components 136.

Figure 2:
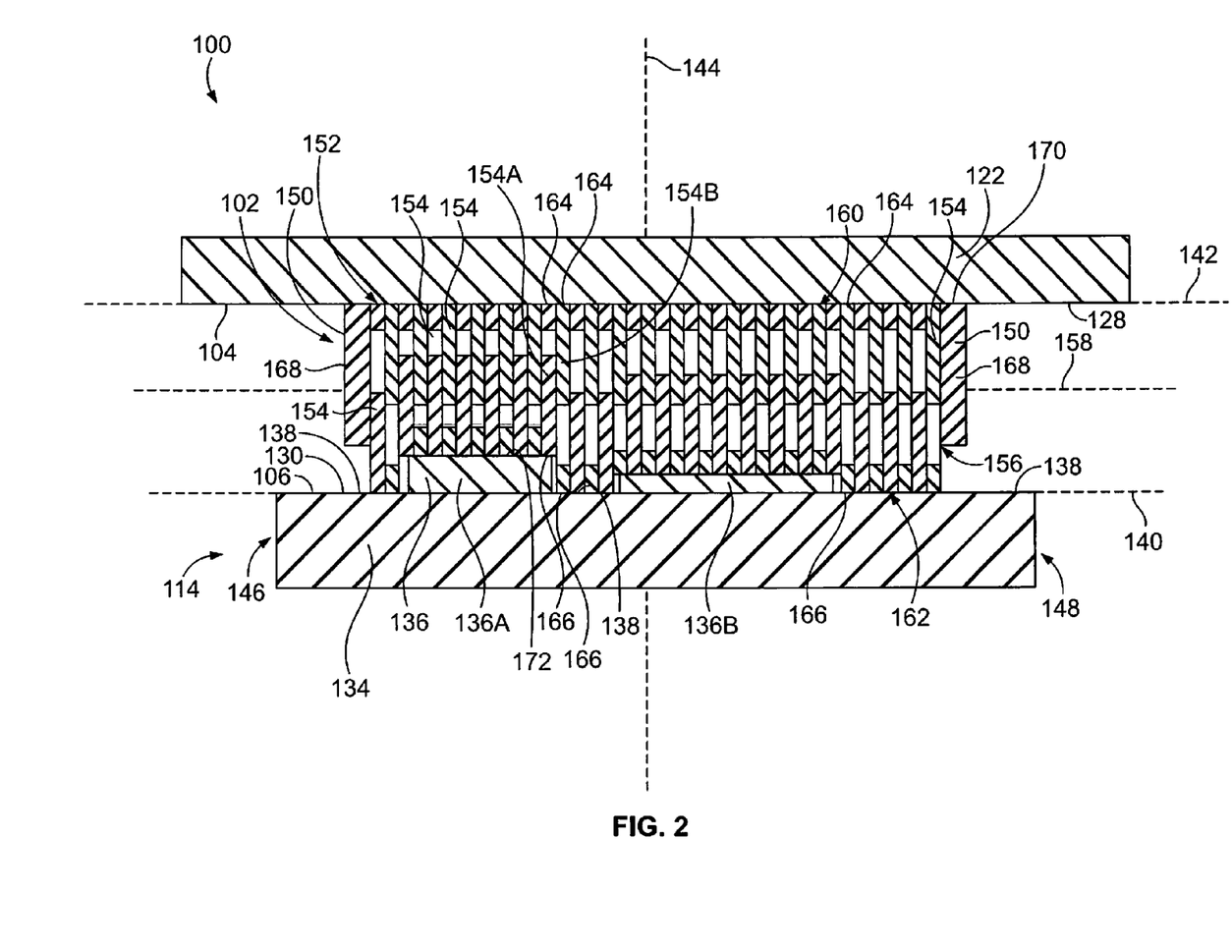
FIG. 2 is a cross-sectional view of the heat transfer system shown in FIG. 1.

FIG. 2 is a cross-sectional view of the heat transfer system 100 along line 2-2 shown in FIG. 1. The electronics package 114 that defines the second external surface 106 includes the printed circuit board 134 and two electrical components 136. The electrical components 136 are mounted on the outer layer 138 of the printed circuit board 134 and extend from the outer layer 138 towards the interior surface 128 of the shell member 122 that defines the first external surface 104. For example, the outer layer 138 is planar and defines a circuit board plane 140. The interior surface 128 of the shell member 122 is planar and defines a shell plane 142. The shell plane 142 is parallel to the circuit board plane 140 in the illustrated embodiment. Each of the electrical components 136 may be a resistor, a capacitor, a transistor, an inductor, an integrated circuit, an LED, an active electric-optic converting circuit, or the like. For example, a first electrical component 136A of the electrical components 136 may be an active electric-optic converting circuit that converts electrical signals to optical signals and/or vice-versa, and a second electrical component 136B of the electrical components 136 may be an integrated processing circuit.

The first electrical component 136A extends farther from the outer layer 138 of the circuit board 134 than the second electrical component 136B, such that the first electrical component 136A is taller along a vertical axis 144 than the second electrical component 136B. The axis 144 is referred to as a "vertical" axis for reference and comparison between the components of the heat transfer system 100 only. Although the vertical axis 144 appears to extend generally parallel to gravity, it is recognized that the heat transfer system 100 is not required to have any particular orientation with respect to gravity. For example, the heat transfer system 100 may be oriented such that the "vertical" axis 144 extends transverse to a direction of gravity.

The first electrical component 136A extends more proximate to the interior surface 128 of the shell member 122 than the second electrical component 136B. The contour of the outer surface 130 of the electronics package 114 is defined, from a first end 146 to a second end 148 of the electronics package 114, by a first segment of the outer layer 138, the first electrical component 136A, a second segment of the outer layer 138 between the first and second electrical components 136A, 136B, the second electrical component 136B, and finally a third segment of the outer layer 138.

The thermal bridge 102 includes a frame 150 and an array 152 of multiple plates 154. The frame 150 defines a bridge opening 156 through the frame 150, and the array 152 of plates 154 is held in the bridge opening 156. In FIG. 2, the frame 150 is shown in cross-section in order to view the plates 154 held within the frame 150. The plates 154 are stacked side-by-side along a stack axis 158 such that faces of adjacent plates 154 abut one another. The plates 154 are thermally conductive to transfer heat therethrough. The array 152 extends vertically (for example, along the vertical axis 144) between a top end 160 and a bottom end 162. The top end 160 of the array 152 is defined by top edges 164 of the plates 154, and the bottom end 162 is defined by bottom edges 166 of the plates 154. As used herein, relative or spatial terms such as "top," "bottom," "first," "second," "left," and "right" are only used to distinguish the referenced elements and do not necessarily require particular positions or orientations in the heat transfer system 100 or in the surrounding environment of the heat transfer system 100. The top end 160 of the array 152 is configured to engage the interior surface 128 of the shell member 122. The bottom end 162 of the array 152 is configured to engage the outer surface 130 of the electronics package 114.

The top and bottom ends 160, 162 of the array 152 are exposed relative to the frame 150 to engage the corresponding surfaces 128, 130. The frame 150 borders the array 152 of plates 154 along perimeter sides of the array 152 (for example, front, back, left, and right sides), but does not extend along the top or bottom ends 160, 162, which protrude from the bridge opening 156 of the frame 150. The frame 150 includes end sections 168 that define portions of the bridge opening 156. The end sections 168 engage the two outer plates 154 of the array 152 and restrict outward movement of the outer plates 154 along the stack axis 158 such that adjacent plates 154 in the array 152 mechanically engage one another without a lateral gap existing between two or more adjacent plates 154. The end sections 168 may press the outer plates 154 towards one another along the stack axis 158. The end sections 168 are fixed in place and press the corresponding outer plates 154 by applying normal forces or "gathering" forces on the plates 154 in opposing directions along the stack axis 158. In the illustrated embodiment, a top 170 of the frame 150 may be mounted to the interior surface 128 of the shell member 122 to secure the frame 150 in place. In other embodiments, however, the frame 150 may be mounted to another component or may not be mechanically mounted to any component. Although the frame 150 provides a perimeter border around the array 152, the plates 154 are held in place vertically by being compressed or sandwiched between the interior surface 128 of the shell member 122 and the outer surface 130 of the electronics package 114.

In an exemplary embodiment, the plates 154 in the array 152 are independently vertically compressible between the respective top and bottom edges 164, 166 relative to other plates 154 in the array 152. Thus, one plate 154 may be compressed between the interior surface 128 of the shell member 122 and the outer surface 130 of the electronics package 114 to a greater extent than an adjacent plate 154 in the array 152. As each plate 154 is compressed, the height of the plate 154 between the respective top edge 164 and bottom edge 166 decreases (shortening the plate 154). The plates 154 are configured to be resiliently compressible between a compressed state and an uncompressed state such that when a biasing force on one plate 154 is removed or at least reduced, the plate 154 resiliently returns toward the uncompressed state. As the plate 154 returns toward the uncompressed state, the height of the plate 154 between the top edge 164 and the bottom edge 166 increases. Since the plates 154 are independently vertically compressible and are stacked side-by-side, the top end 160 of the array 152 is able to conform to the contour of the interior surface 128, and the bottom end 162 is able to conform to the contour of the outer surface 130. By conforming to the contours of the surfaces 128, 130, the thermal bridge 102 engages a greater percentage and/or amount of surface area of the surfaces 128, 130 than known thermal bridges that are formed of unitary, one-piece blocks.

In an embodiment, the top edge 164 of each plate 154 in the array 152 is configured to engage the interior surface 128 of the shell member 122, and the bottom edge 166 of each plate 154 in the array 152 is configured to engage the outer surface 130 of the electronics package 114. The edges 164, 166 of the plates 154 may engage the corresponding surfaces 128, 130 directly or indirectly via a thermal interface material (not shown) applied between the plates 154 and the surfaces 128, 130. The thermal interface material may include an underfilm, an encapsulant, a putty, or the like, and different thermal interface materials may be used on the top edge 164 versus the bottom edge 166.

A pair of adjacent plates 154 in the illustrated embodiment includes a first plate 154A and a second plate 154B. The top edges 164 of the first and second plates 154A, 154B both engage the interior surface 128 of the shell member 122. Since the interior surface 128 is planar, the top edges 164 are laterally aligned with one another (such that the top edges 164 are at the same height along the vertical axis 144). The bottom edge 166 of the first plate 154A engages the first electrical component 136A. The bottom edge 166 of the second plate 154B engages the outer layer 138 of the printed circuit board 134. For example, the first plate 154A aligns with an edge of the first component 136A, while the second plate 154B is offset laterally along the stack axis 158 from the first component 136A. Since the electrical component 136A extends towards the interior surface 128 from the outer layer 138 of the circuit board 134 (and the interior surface 128 is planar), a first clearance distance between a top surface 172 of the electrical component 136A and the interior surface 128 is less than a second clearance distance between the outer layer 138 and the interior surface 128. Therefore, the first plate 154A, which is disposed within the first clearance distance, is more compressed than the second plate 154B, which is disposed within the second clearance distance. In an embodiment, both plates 154A, 154B are thermally conductive and engage both the interior surface 128 and the outer surface 130. Thus, each plate 154A, 154B provides a conductive path to transfer heat from the electronics package 114 to the shell member 122 to cool the electronics package 114. In one or more embodiments, as described below, the conductive paths defined by the plates 154 are not isolated from one another, as the plates 154 are configured to allow for heat transfer between adjacent plates 154.

In an alternative embodiment, the second plate 154B may be an insulative plate that is formed of a thermally insulative material instead of a thermally conductive material. The thermally insulative material may be or include a dielectric plastic material, a polymeric foam material, or the like. The thermally insulative plate 154B provides a thermal barrier that thermally separates the plates 154 that engage the first electrical component 136A (for example, plate 154A) from the plates 154 on the other side of the plate 154B that engage the second electrical component 136B. Thus, in an embodiment, the one or more of the plates 154 of the thermal bridge 102 that are configured to extend between electrical components 136 without engaging the electrical components 136 directly are thermally insulative instead of thermally conductive.

Figure 3:
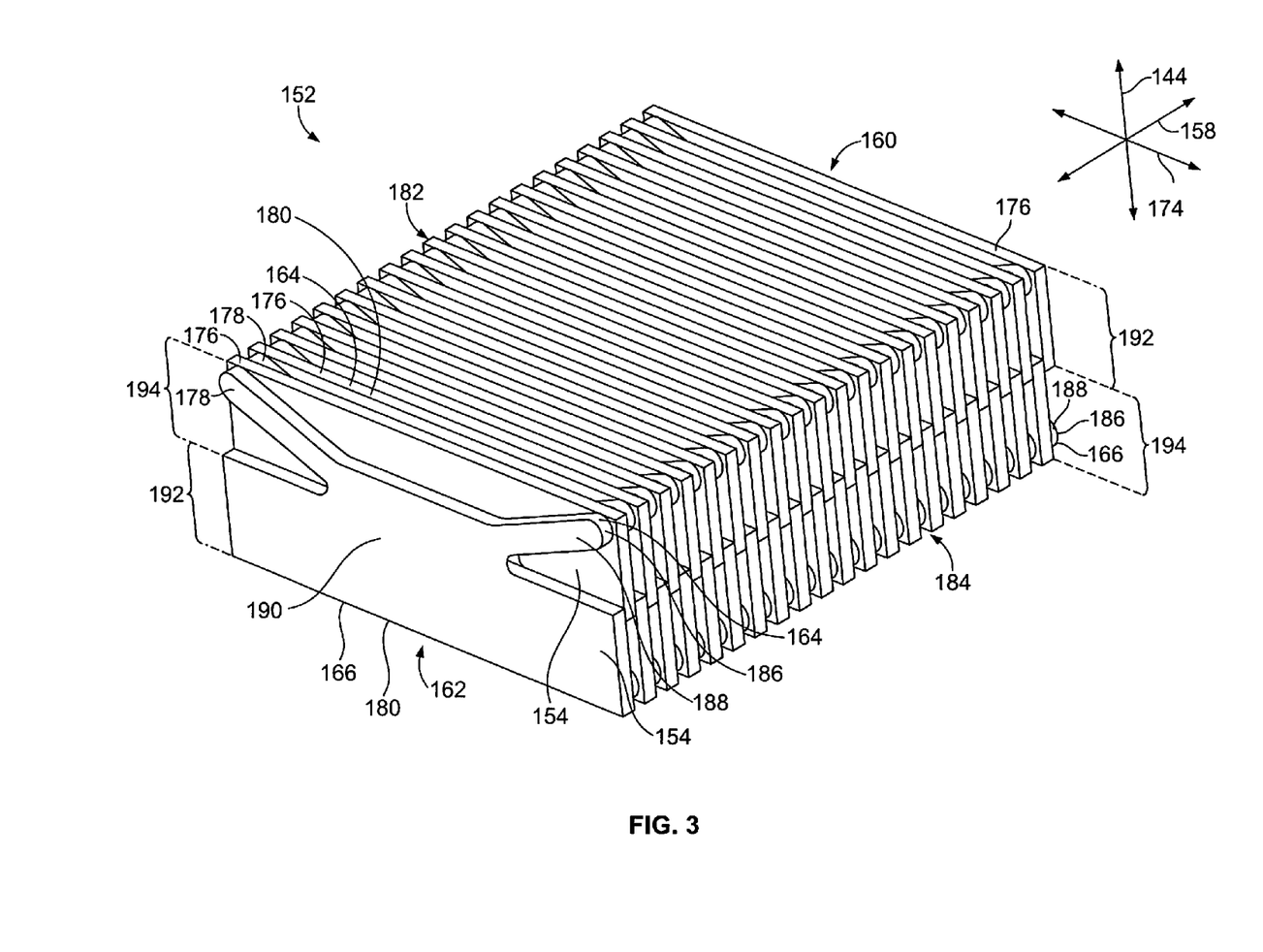
FIG. 3 is a perspective view of an array of plates of a thermal bridge according to an embodiment.

FIG. 3 is a perspective view of the array 152 of plates 154 of the thermal bridge 102 (shown in FIG. 2) according to an embodiment. The array 152 of plates 154 is oriented with respect to the vertical axis 144, the lateral stack axis 158, and a longitudinal axis 174. The axes 144, 158, 174 are mutually perpendicular. In an embodiment, the array 152 includes an alternating sequence of upper plates 176 and lower plates 178. The upper plates 176 have the same size and shape as the lower plates 178. The upper plates 176 are rotated 180° relative to the lower plates 178 about the stack axis 158. In FIG. 3, the outer plate 154 that is fully visible is a lower plate 178. The top edges 164 of the upper plates 176 are planar edges 180 that extend longitudinally between a first side 182 and a second side 184 of the array 152. The lower plates 178 have the planar edges 180 along the bottom edges 166 of the plates 178. The bottom edges 166 of the upper plates 176 and the top edges 164 of the lower plates 178 are defined by distal ends 186 of contact beams 188 in the illustrated embodiment. The array 152 may have other numbers of total plates 154 and/or other numbers, shapes, and/or arrangements of upper and lower plates 176, 178 in alternative embodiments.

In an embodiment, each plate 154 (including the upper plates 176 and lower plates 178) has a unitary, one-piece body 190. The plates 154 are formed of a thermally conductive material, such as copper, aluminum, an alloy containing copper and/or aluminum, or another metal. The plates 154 may be formed by stamping and forming the bodies 190 from a panel of sheet metal, by a casting process, or a like metal-forming process. Alternatively, the plates 154 may include a polymer material in addition to the metal material, such as by disposing metal particles in a polymer during a molding process. The plates 154 may be identical to each other or at least substantially similar in size, shape, and composition.

The body 190 of each plate 154 includes a rigid segment 192 and a deformable segment 194. The deformable segment 194 is vertically compressible along a height of the plate 154. The rigid segment 192 is generally not compressible. The rigid segment 192 and the deformable segment 194 define adjacent vertical portions of the plate 154. For example, each plate 154 is oriented in the array 152 such that the rigid segment 192 defines the top edge 164 or the bottom edge 166 of the respective plate 154, and the deformable segment 194 defines the other of the top edge 164 or the bottom edge 166 of the respective plate 154. In FIG. 3, the upper and lower plates 176, 178 are oriented such that the top end 160 of the array 152 is defined by the rigid segments 192 of the upper plates 176 and the deformable segments 194 of the lower plates 178. In addition, the bottom end 162 of the array 152 is defined by the deformable segments 194 of the upper plates 176 and the rigid segments 192 of the lower plates 178.

Figure 4:
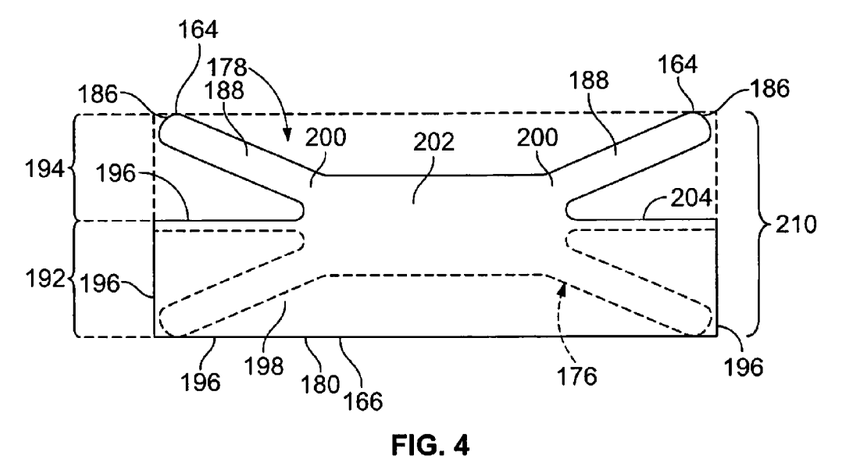
FIG. 4 is a front view of one plate of the array of plates in an uncompressed state.

FIG. 4 is a front view of a lower plate 178 of the array 152 of plates 154 shown in FIG. 3 in an uncompressed state. For example, the lower plate 178 shown in FIG. 4 is not disposed between and in engagement with the first external surface 104 (shown in FIG. 2) and the second external surface 106 (FIG. 2), so the lower plate 178 is not compressed between the external surfaces 104, 106. In the illustrated embodiment, the rigid segment 192 has a generally rectangular shape. The rigid segment 192 is solid along edges 196 and faces 198 thereof such that the rigid segment 192 lacks holes, indentations, cutouts, slots, and the like. The planar edge 180 of the rigid segment 192 defines the bottom edge 166 of the lower plate 178. The solid rectangular shape of the rigid segment 192 provides the rigid segment 192 with structural strength as well as substantial surface area to face an adjacent plate and transfer heat.

The deformable segment 194 of the lower plate 178 includes at least one deflectable contact beam 188 that extends generally away from the rigid segment 192. Each contact beam 188 is cantilevered to extend from a fixed end 200 to a distal free end 186. The fixed end 200 is located proximate to the rigid segment 192. The fixed end 200 is connected to a base portion 202 of the deformable segment 194. The base portion 202 is centrally located along the longitudinal axis 174 (shown in FIG. 3) and extends upwards from a top edge 204 of the rigid segment 192. The distal end 186 of each contact beam 188 defines the top edge 164 of the lower plate 178. In the illustrated embodiment, the deformable segment 194 includes two deflectable contact beams 188. In other embodiments, the deformable segment 194 may include only one or more than two contact beams 188.

FIG. 4 also shows a phantom outline of one of the upper plates 176. In an exemplary embodiment, the upper and lower plates 176, 178 have the same shape and are rotated or flipped 180° relative to each other. Thus, the description of the rigid segment 192 and the deformable segment 194 of the lower plate 178 also applies to the upper plate 176.

Figure 5:
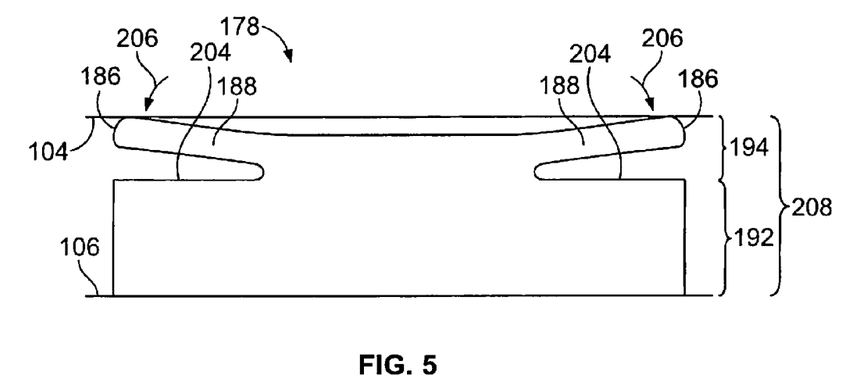
FIG. 5 is a front view of the plate of FIG. 4 in a compressed state.

FIG. 5 is a front view of the lower plate 178 of FIG. 4 in a compressed state. The lower plate 178 in FIG. 5 is disposed between the first external surface 104 and the second external surface 106. In the compressed state, the contact beams 188 of the deformable segment 194 engage and are deflected by the first external surface 104. The contact beams 188 deflect along respective arcs 206 generally downward towards the top edge 204 of the rigid segment 192. In the compressed state, the distal ends 186 of the contact beams 188 are located more proximate to the rigid segment 192 than when the lower plate 178 is in the uncompressed state shown in FIG. 4. As a result, a height 208 of the lower plate 178 in the compressed state is less or shorter than a height 210 (shown in FIG. 4) of the lower plate 178 in the uncompressed state. The height 208 of the lower plate in the compressed state conforms to the distance between the first and second external surfaces 104, 106. Thus, the amount of deflection of the contact beams 188 is dependent on the distance or clearance between the first and second surfaces 104, 106 occupied by the lower plate 178.

In an embodiment, the contact beams 188 are resiliently deflectable such that the contact beams 188 apply a biasing force against the first external surface 104, which retains mechanical engagement between the lower plate 178 and the first external surface 104. In addition, the contact beams 188 are configured to return towards the positions of the beams 188 shown in FIG. 4 after the force from the first external surface 104 is removed.

As shown in FIG. 5, only the distal ends 186 of the contact beams 188 engage the first external surface 104, so the contact interface between the plate 178 and the surface 104 is small, which may result in lower heat transfer from the plate 178 to the surface 104 (due to a high thermal resistance at the interface). As described below in FIG. 6, adjacent plates 154 (shown in FIG. 3) are configured to transfer heat therebetween such that the rigid segments 192 of the upper plates 176 (FIG. 3), and not the deformable segments 194 of the lower plates 178, provide a majority of the heat transfer from the thermal bridge 102 (FIG. 2) to the first external surface 104.

Figure 6:
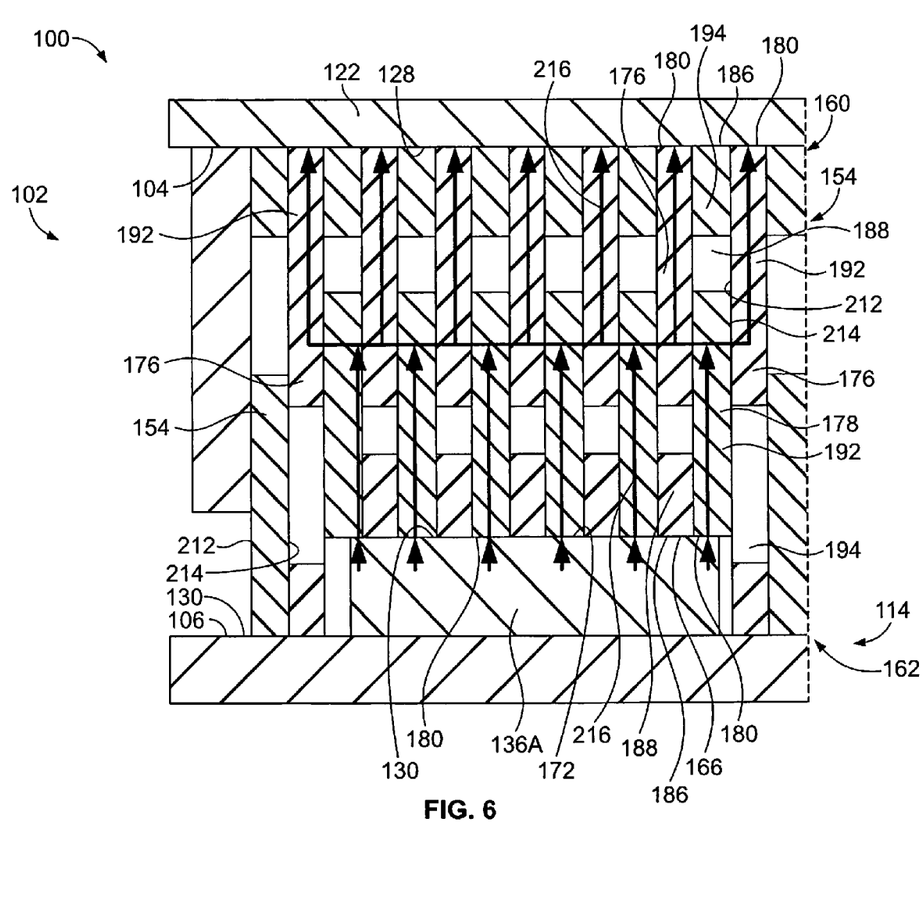
FIG. 6 is a cross-sectional view of a portion of the heat transfer system according to the embodiment shown in FIG. 2.

FIG. 6 is a cross-sectional view of a portion of the heat transfer system 100 according to the embodiment shown in FIG. 2. The cross-sectional view is taken along line 2-2 shown in FIG. 1. The plates 154 each define a front face 212 and an opposite rear face 214. In an embodiment, the faces 212, 214 are planar. Opposing planar faces 212, 214 of adjacent plates 154 in the array 152 abut one another to allow face-to-face heat conduction between the adjacent plates 154. Thus, heat may be transferred vertically between the top and bottom ends 160, 162 of the array 152 as well as horizontally across and between the plates 154.

As shown in FIG. 6, the rigid segments 192 of the upper plates 176 engage the first external surface 104, and the deformable segments 194 of the upper plates 176 engage the second external surface 106. With reference to the lower plates 178, the deformable segments 194 engage the first external surface 104, and the rigid segments 192 engage the second external surface 106. The front planar faces 212 of at least some of the upper plates 176 abut corresponding opposing rear planar faces 214 of adjacent lower plates 178 to allow face-to-face heat conduction between the upper and lower plates 176, 178.

The arrows 216 illustrate potential heat transfer routes through the thermal bridge 102 from the outer surface 130 of the electronics package 114 that defines the second external surface 106 to the interior surface 128 of the shell member 122 that defines the first external surface 104. The heat transfer routes illustrated by the arrows 216 are exemplary and do not define the only routes for heat transfer through the thermal bridge 102. Heat generated by the first electrical component 136A is absorbed by the rigid segments 192 of the lower plates 178 that engage the top surface 172 of the electrical component 136A. The heat is absorbed by the lower plates 178 more so than by the upper plates 176 because the long planar edges 180 of the lower plates 178 provide more surface area at the contact interface (and therefore lower thermal resistance to heat transfer) than the distal ends 186 of the contact beams 188 that define the bottom edges 166 of the upper plates 176. Within the thermal bridge 102, the heat illustrated by the arrows 216 transfers laterally, via face-to-face conduction, from the lower plates 178 to the adjacent upper plates 176. The heat is then transferred from the rigid segments 192 of the upper plates 176 to the shell member 122. Heat is more readily transferred to the shell member 122 from the upper plates 176 than from the lower plates 178 due to the difference in contact surface area and thermal resistance between the long planar edges 180 of the upper plates 176 and the distal ends 186 of the contact beams 188 of the lower plates 178.

Figure 7:
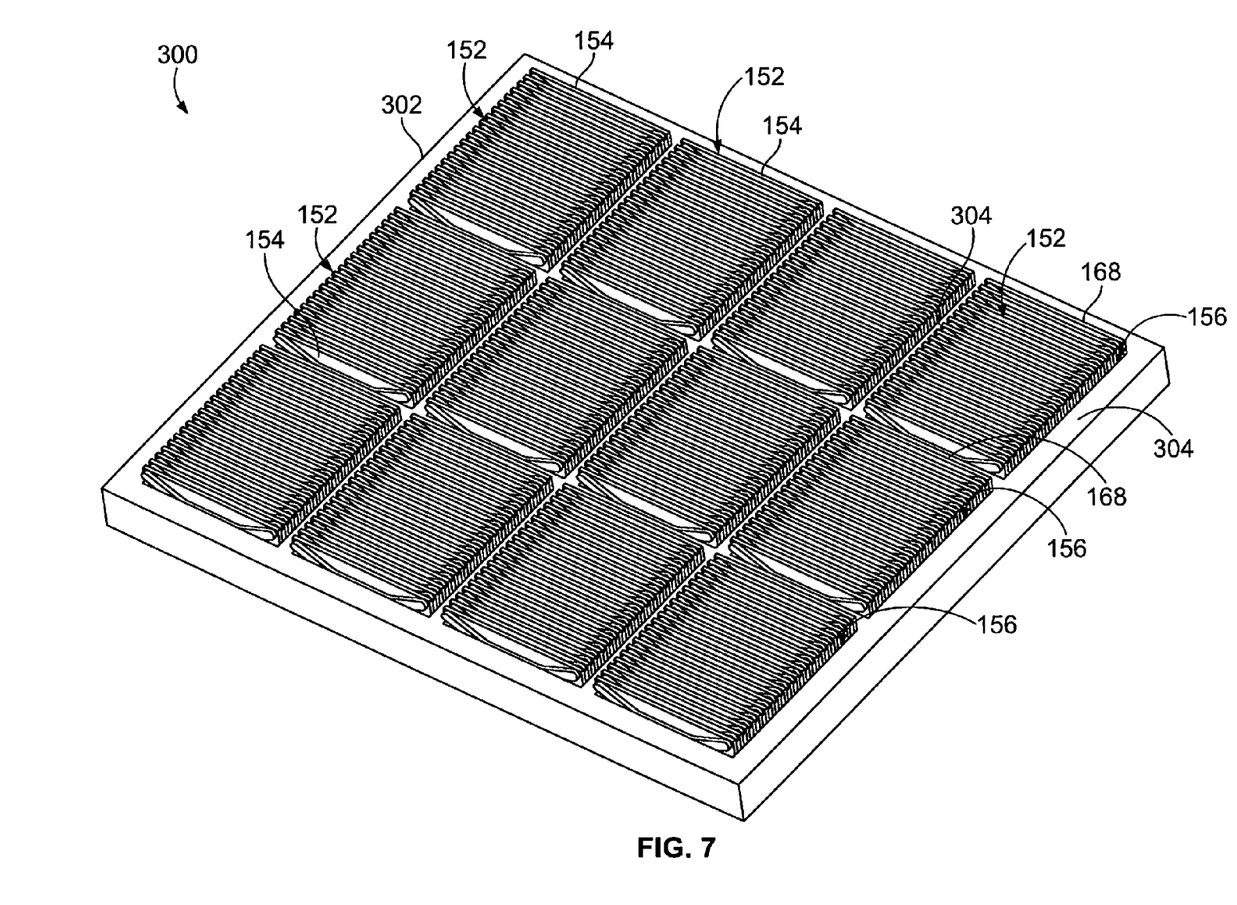
FIG. 7 is a perspective view of a thermal bridge of the heat transfer system according to another embodiment.

FIG. 7 is a perspective view of a thermal bridge 300 of the heat transfer system 100 (shown in FIG. 1) according to another embodiment. The thermal bridge 300 includes one frame 302 and multiple arrays 152 of plates 154. Each of the arrays 152 may be identical to or at least similar to the array 152 of plates 154 shown in FIG. 3. The frame 302 defines twelve bridge openings 156 for holding twelve arrays 152. The frame 302 defines end sections 168 and side sections 304 that define the bridge openings 156. For example, the end sections 168 are arranged in rows, and the side sections 304 are arranged in columns. The frame 302 may be formed of one or more metal materials and/or polymer materials. The thermal bridge 300 may be used to provide cooling to multiple electronics packages 114 (shown in FIG. 2) or to one large electronics package 114. The thermal bridge 300 illustrates how the thermal bridge 102 shown in FIG. 2 may be scaled up in size depending on particular applications, without necessarily increasing the size of the individual plates 154. Thus, the thermal bridge 300 may be as conformable as the thermal bridge 102.

In an alternative embodiment, the frame 302 may be configured to hold multiple arrays 152 of plates 154 in the same bridge opening 156. For example, at least some of the side sections 304 shown in FIG. 7 may be omitted in order to define a bridge opening 156 that holds the two adjacent arrays 152 on either side of the side section 304. The two adjacent arrays 152 may be held together in mechanical and thermal engagement with each other such that side edges of the plates 154 from one of the arrays 152 engage opposing side edges of the plates 154 of the other array 152.

Figure 8:
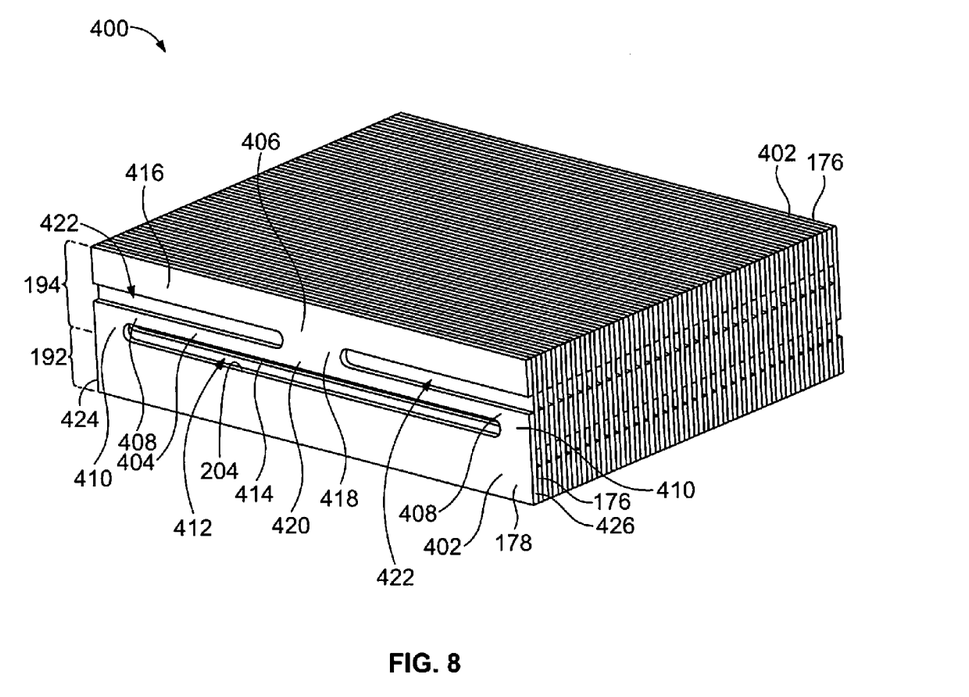
FIG. 8 is a perspective view of an array of plates of the thermal bridge shown in FIG. 2 according to an alternative embodiment.

FIG. 8 is a perspective view of an array 400 of plates 402 of the thermal bridge 102 (shown in FIG. 2) according to an alternative embodiment. The array 400 of the plates 402 may be similar to the array 152 shown in FIG. 3 such that the array 400 includes an alternating sequence of upper plates 176 and lower plates 178. Optionally, the only difference between the array 400 and the array 152 is that the plates 402 have a different shape than the plates 154 (shown in FIG. 3). Like the plates 154, the plates 402 each include a rigid segment 192 and a deformable segment 194. The rigid segment 192 of the plates 402 may have a solid, rectangular shape, like the rigid segment 192 of the plates 154. However, instead of contact beams 188 (shown in FIG. 4), the deformable segment 194 of one or more of the plates 402 includes a horizontal compliant beam 404 and T-shaped member 406.

The outer plate 402 shown in FIG. 8 is in an uncompressed state. The horizontal compliant beam 404 extends horizontally across at least a majority of a longitudinal length of the plate 402 between a first side 424 and a second side 426 of the plate 402. Ends 408 of the compliant beam 404 are connected to the rigid segment 192 via supports 410. An accommodation window 412 is defined through the plate 402. The accommodation window 412 extends vertically between the top edge 204 of the rigid segment 192 and a bottom 414 of the compliant beam 404. The accommodation window 412 extends horizontally between the supports 410. The T-shaped member 406 includes a horizontally-extending cross-bar 416 and a vertically-extending leg 418 that connects the cross-bar 416 to a medial region 420 of the compliant beam 404. The plate 402 defines side slots 422 that extend through the plate 402 vertically between the cross-bar 416 and the compliant beam 404 and horizontally between the leg 418 and the corresponding sides 424, 426 of the plate 402.

Figure 9:
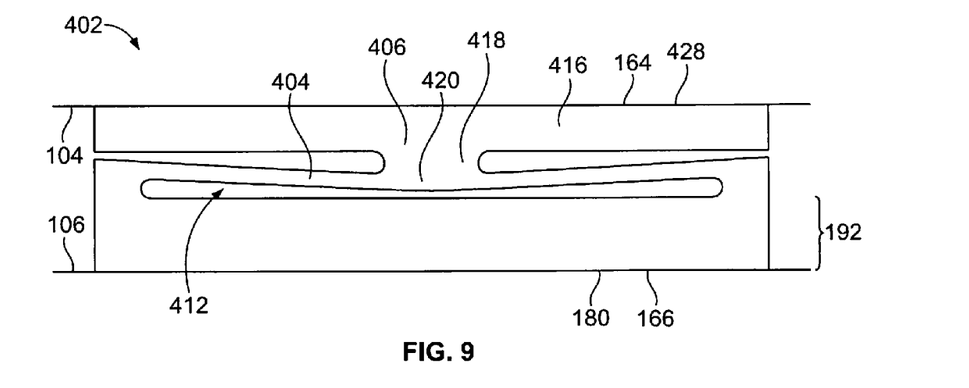
FIG. 9 is a front view of one plate of the array of plates shown in FIG. 8 in a compressed state.

FIG. 9 is a front view of one plate 402 of the array 400 shown in FIG. 8 in a compressed state. The plate 402 is compressed between the first external surface 104 and the second external surface 106. The first external surface 104 engages the cross-bar 416 of the T-shaped member 406 and forces the T-shaped member 406 towards the rigid segment 192. More specifically, the leg 418 of the T-shaped member 406 depresses the medial region 420 of the compliant beam 404, bending the compliant beam 404 into a bowed shape that extends at least partially into the accommodation window 412. The T-shaped member 406 is disposed more proximate to the rigid segment 192 than when the plate 402 is in the uncompressed state shown in FIG. 8. Thus, the height of the plate 402 is less in the compressed state relative to the uncompressed state in order to accommodate the space defined between the first and second external surfaces 104, 106.

As shown in FIG. 9, the bottom edge 166 of the plate 402 is defined by the planar edge 180 of the rigid segment 192, which defines a large contact surface area for heat transfer between the second external surface 106 and the plate 402. The top edge 164 of the plate 402 is defined by the cross-bar 416 of the T-shaped member 406. Unlike the contact beams 188 (shown in FIG. 4) of the plates 154 (FIG. 3), the cross-bar 416 includes a planar edge 428 that engages the first external surface 104. The planar edge 428 may have similar heat transfer properties as the planar edge 180 of the rigid segment 192. Thus, the array 400 of the plates 402 may be able to transfer more heat at lower thermal resistance between the first and second external surfaces 104, 106 relative to the array 152 (shown in FIG. 3) of the plates 154.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A thermal bridge comprising:
a frame defining a bridge opening that extends through the frame; and
an array of multiple plates held in the bridge opening of the frame, the plates having front planar faces and opposite rear planar faces, the plates stacked side-by-side along a stack axis, the front and rear planar faces of the plates oriented perpendicular to the stack axis, the array extending between a top end defined by top edges of the plates and a bottom end defined by bottom edges of the plates, each plate being independently vertically compressible between the respective top and bottom edges of the plate relative to other plates in the array, the top end of the array being configured to engage and conform to a contour of a first external surface, the bottom end of the array being configured to engage and conform to a contour of a second external surface, the plates being thermally conductive to transfer heat between the first and second external surfaces.

2. The thermal bridge of claim 1, wherein the top edge of each plate in the array is configured to engage the first external surface and the bottom edge of each plate in the array is configured to engage the second external surface.

3. The thermal bridge of claim 1, wherein the second external surface is an outer surface of an electronics package that includes a printed circuit board and at least one electrical component mounted on an outer layer of the printed circuit board, the bottom end of the array being configured to engage and conform to the contour of the second external surface such that the bottom edge of a first plate in the array engages one of the at least one electrical components and the bottom edge of a second plate adjacent to the first plate engages the outer layer of the printed circuit board.

4. The thermal bridge of claim 3, wherein the first external surface is an interior surface of a shell member, the top edges of the first and second plates both engaging the interior surface of the shell member, the shell member being thermally conductive, the first and second plates configured to transfer heat from the electronics package to the shell member to cool the electronics package.

5. The thermal bridge of claim 1, wherein the array of plates includes an alternating sequence of upper plates and lower plates, the upper plates having a same size and shape as the lower plates, the upper plates being rotated 180 about the stack axis relative to the lower plates.

6. The thermal bridge of claim 1, wherein the front planar face of a first plate in the array abuts the rear planar face of an adjacent second plate in the array to allow face-to-face heat conduction between the first and second plates.

7. The thermal bridge of claim 1, wherein each plate has a unitary, one-piece body including a rigid segment and a deformable segment, each plate oriented such that the respective rigid segment defines one of the top edge or the bottom edge of the plate and the deformable segment defines the other of the top edge or the bottom edge of the plate, the deformable segment vertically compressible, the rigid segment not vertically compressible.

8. The thermal bridge of claim 7, wherein the rigid segment of one or more of the plates has a generally rectangular shape and lacks holes and indentations, the one of the top edge or the bottom edge defined by the rigid segment being a planar edge extending a length of the plate.

9. The thermal bridge of claim 7, wherein the deformable segment of one or more of the plates includes at least one deflectable contact beam extending from a fixed end attached to the rigid segment to a distal free end spaced apart from the rigid segment, wherein, in a compressed state of the one or more plates, the at least one deflectable contact beam is deflected such that the distal end is disposed more proximate to the rigid segment than when the one or more plates are in an uncompressed state.

10. The thermal bridge of claim 7, wherein the deformable segment of one or more of the plates includes a horizontal compliant beam and a T-shaped member, the T-shaped member including a horizontally-extending cross-bar and a vertically-extending leg that connects the cross-bar to a medial region of the compliant beam, wherein, in a compressed state of the one or more plates, the medial region of the compliant beam is depressed by the T-shaped member and the T-shaped member is disposed more proximate to the rigid segment than when the one or more plates are in an uncompressed state.

11. The thermal bridge of claim 1, wherein end sections of the frame engage corresponding outer plates of the array to restrict outward movement of the outer plates along the stack axis such that adjacent plates in the array mechanically engage one another without a lateral gap existing between two or more adjacent plates.

12. The thermal bridge of claim 1, wherein the frame borders the array of plates along four sides of the array, the frame not bordering the array along the top end or the bottom end of the array.

13. A thermal bridge comprising:
a frame defining a bridge opening that extends through the frame; and
an array of multiple plates held in the bridge opening of the frame, the array extending vertically between a top end and a bottom end, the plates stacked side-by-side along a stack axis, the plates having unitary, one-piece bodies that each include a rigid segment and a deformable segment, the deformable segment of each plate being independently vertically compressible relative to other plates in the array, the array of plates including upper plates and lower plates arranged in an alternating sequence, the upper plates having a same size and shape as the lower plates and being rotated 180° about the stack axis relative to the lower plates, the top end of the array being defined by the rigid segments of the upper plates and the deformable segments of the lower plates, the bottom end of the array being defined by the deformable segments of the upper plates and the rigid segments of the lower plates,
wherein the top end of the array is configured to engage and conform to a contour of a first external surface and the bottom end of the array is configured to engage and conform to a contour of a second external surface, the plates being thermally conductive to transfer heat between the first and second external surfaces.

14. The thermal bridge of claim 13, wherein the rigid segments of the upper plates engage the first external surface and the deformable segments of the upper plates engage the second external surface.

15. The thermal bridge of claim 13, wherein the deformable segments of the lower plates engage the first external surface and the rigid segments of the lower plates engage the second external surface.

16. The thermal bridge of claim 13, wherein the upper and lower plates each define a front planar face and an opposite rear planar face, the front planar faces of at least some of the upper plates abutting the opposing rear planar faces of corresponding adjacent lower plates to allow face-to-face heat conduction between the upper and lower plates.

17. The thermal bridge of claim 13, wherein the deformable segment of one or more of the plates includes at least two deflectable contact beams extending from respective fixed ends attached to the rigid segment to respective distal free ends spaced apart from the rigid segment, wherein, in a compressed state of the one or more plates, the deflectable contact beams are deflected such that the distal ends are disposed more proximate to the rigid segment than when the one or more plates are in an uncompressed state.

18. The thermal bridge of claim 13, wherein the deformable segment of one or more of the plates includes a horizontal compliant beam and a T-shaped member, the T-shaped member including a horizontally-extending cross-bar and a vertically-extending leg that connects the cross-bar to a medial region of the compliant beam, wherein, in a compressed state of the one or more plates, the medial region of the compliant beam is depressed by the T-shaped member and the T-shaped member is disposed more proximate to the rigid segment than when the one or more plates are in an uncompressed state.

19. The thermal bridge of claim 13, wherein end sections of the frame engage corresponding outer plates of the array and press the outer plates towards one another along the stack axis such that adjacent plates in the array mechanically engage one another without a lateral gap existing between two or more adjacent plates.

20. The thermal bridge of claim 13, wherein the second external surface is an outer surface of an electronics package that includes a printed circuit board and an electrical component mounted on an outer layer of the printed circuit board, a first plate in the array engaging the electrical component and a second plate in the array adjacent to the first plate engaging the outer layer of the printed circuit board, the first external surface being a planar surface that is engaged by both the first plate and the second plate such that the first plate is more compressed than the adjacent second plate.

* * * * *